(12) United States Patent
Godard et al.

(10) Patent No.: US 7,567,448 B2
(45) Date of Patent: Jul. 28, 2009

(54) CONTENT ADDRESSABLE MEMORY CELL HAVING A SINGLE FLOATING GATE TRANSISTOR

(75) Inventors: Benoit Godard, Aix en Provence (FR); Olivier Ginez, Peynier (FR); Jean Michel Daga, Peynier (FR)

(73) Assignee: Atmel Corporation, San Jose, CA (US)

( * ) Notice: Subject to any disclaimer, the term of this patent is extended or adjusted under 35 U.S.C. 154(b) by 157 days.

(21) Appl. No.: 11/650,104

(22) Filed: Jan. 5, 2007

(65) Prior Publication Data

US 2008/0165557 A1    Jul. 10, 2008

(51) Int. Cl.
G11C 15/00 (2006.01)
G11C 11/34 (2006.01)
G11C 16/04 (2006.01)

(52) U.S. Cl. .............. 365/49.1; 365/185.01; 365/49.17
(58) Field of Classification Search ............ 365/185.01, 365/49.1, 49.17
See application file for complete search history.

(56) References Cited

U.S. PATENT DOCUMENTS

| 5,051,948 | A | 9/1991 | Watabe et al. |
| 5,111,427 | A | 5/1992 | Kobayashi et al. |
| 6,005,790 | A | 12/1999 | Chan et al. |
| 6,242,304 | B1 | 6/2001 | Geusic et al. |
| 6,317,349 | B1 | 11/2001 | Wong |
| 6,396,749 | B2 * | 5/2002 | Al-Shamma et al. ........ 365/200 |
| 6,476,441 | B2 | 11/2002 | Geusic et al. |
| 6,706,597 | B2 | 3/2004 | Geusic et al. |
| 6,944,038 | B2 | 9/2005 | de Sandre |
| 7,031,177 | B2 | 4/2006 | de Sandre |
| 7,050,332 | B2 | 5/2006 | Kamei et al. |
| 2006/0133122 | A1 * | 6/2006 | Haid et al. ..................... 365/45 |
| 2006/0139982 | A1 * | 6/2006 | de Sandre .................... 365/49 |
| 2006/0285374 | A1 * | 12/2006 | Szeto et al. .................... 365/49 |
| 2007/0064461 | A1 * | 3/2007 | Srinivasan et al. ............ 365/49 |
| 2007/0165436 | A1 * | 7/2007 | Sarin et al. .................... 365/49 |
| 2008/0043507 | A1 * | 2/2008 | Srinivasan et al. ......... 365/49.1 |
| 2008/0071781 | A1 * | 3/2008 | Ninan et al. ................... 707/6 |

* cited by examiner

*Primary Examiner*—Ly D Pham
(74) *Attorney, Agent, or Firm*—Schwegman, Lundberg & Woessner P.A.

(57) ABSTRACT

A method and system for providing a content addressable memory cell (CAM) as well as the CAM are disclosed. In one aspect, the method and system include providing a plurality of memory cells, at least one search line and at least one match line. Each of the CAM cells includes a FLOating gate Tunnel OXide (FLOTOX) element. The FLOTOX element includes a single floating gate transistor and a high voltage select transistor and can store at least a portion of a data word. Each CAM cell also preferably includes at least one low voltage transistor capable of comparing the portion of data word stored in the FLOTOX element with the portion of searched word. The search line(s) provide search word(s). The comparator(s) are connected with the search line(s) and the memory cells. The comparator(s) compare the data word stored by the portion of the plurality of memory cells and the search word. The match line(s) indicate whether the search word matches the data word stored by the portion of the plurality of memory cells.

16 Claims, 7 Drawing Sheets

CONTENT ADDRESSABLE MEMORY CELL HAVING A SINGLE FLOATING GATE TRANSISTOR

FIELD OF THE INVENTION

The method and system relates to semiconductor devices and more particularly to a method and system for providing a nonvolatile content addressable memory (CAM) that uses a unique non-volatile core cell, the FLOating gate Tunneling OXide (FLOTOX) element.

BACKGROUND OF THE INVENTION

Semiconductor memory devices may be accessed in a number of ways. In conventional static and dynamic random access memories (RAMs), the address for the location of the desired data is furnished. The contents of this location, or data, in memory are then accessed. The contents of the location can then be returned. Another kind of semiconductor memory devices are Content Addressable Memories (CAMs). CAMs are accessed based upon the content of a memory location, or data, stored in the memory. The address of the location can then be returned. The CAM can refer to a binary CAM or a ternary CAM. Certain (binary) CAMs are accessed based upon an exact match of the data stored in memory and the data provided for the search. In other words, the data provided for the search and data stored include only binary data. For example, only a search of the term 0001 will return the location storing 0001 (if any). A ternary CAM also allows the matching of a "don't care". For example, a ternary CAM may have a stored word that is 0XX1, which will match the search terms 0001, 0011, 0101, and 0111.

FIG. 1 is a high level diagram depicting the architecture of a conventional CAM 60. The conventional CAM cell 10 includes a memory element 20, a comparator 30, a search line (SL) 40, a match line (ML) 50. A plurality of these cells are arranged in a matrix of rows 22 and columns 24 to form a CAM memory array 60. Each row 22 contains a number of cells 10. The match line 50 is preferably common to all cells in a same row 22. Consequently, although only one match line 50 is depicted, there is one match line 50 per row 22. The search line 40 is preferably common to all cells in a same column 24. Consequently, although only one search line 40 is depicted, there is one search line 40 per column 24. Each row 22 can be considered to store at least a data word. In operation, a word desired to be accessed from a row 22 is furnished via the different SLs 40 belonging to a row 22. The data word on the SLs 40 is thus compared to the data in each memory cell 20 of each row 22 using the comparators 30 of each CAM cell 10. Thus, the data stored in each row 22 is compared, bit by bit, to the data provided on the SLs 40. If each bit or memory cell 20, in a row 22 matches the data on a SL 40, then the voltage on the corresponding match line 50 remains unchanged at a pre-charged value. If a bit, or CAM cell 10, in the row 22 does not match the data on the SL 40, then the corresponding match line 50 changes voltage, going to ground. This operation is carried out simultaneously for all rows 22 in the CAM array 60. The row 22 for which the match line stays high has contents that are the same as the desired data provided on the SLs 40. Thus, this row 22 is accessed and the address of the row location is returned. The data in the conventional CAM are, therefore, accessed based on the contents of a row composed of CAM cells 10. Typically, the conventional CAM array 60 has a single cycle throughput. Consequently, the conventional CAM array 60 is typically faster than many other hardware and software based search systems. The conventional CAM 60 may thus be used in a variety of applications requiring a high speed search.

The conventional CAM cell 10 can be either volatile or nonvolatile. Conventional volatile CAM cells 10 were initially developed from static RAM cells. The conventional CAM cells 10 were developed by adding transistors such that an output is provided to a match line 50. More recently, conventional dynamic RAM cells have also been used to provide conventional CAM cells 10. Use of static or dynamic RAM memory element 20 to provide a conventional CAM cell 10 results in conventional CAM cells 10 that are relatively fast. Conventional nonvolatile CAM cells 10 may also be provided. Such nonvolatile CAMs use multiple ETOX memory elements 20 in each CAM cell 10. In addition, multiple transistors are typically used for each CAM cell 10.

Although the conventional CAM cell 10 functions, one of ordinary skill in the art will readily recognize that CAM cells made from either static or dynamic RAMs are volatile. This means that the contents of such conventional CAM cells 10 are re-written each time that the conventional CAM 60 is powered up. Consequently, a separate nonvolatile memory unit must be provided. For example, the nonvolatile memory unit may be a hard disk. If the conventional CAM cell 10 is formed of either static or dynamic RAM elements 20, then data for the CAM 10 would have to be accessed from the nonvolatile memory unit each time the conventional CAM 60 restarts. If a nonvolatile CAM cell 10 is desired, then the data in the conventional CAM cell 10 must remain even after the supply voltage is cut off. Consequently, the use of the relatively fast static and dynamic RAM cells is not feasible for nonvolatile CAM 60. Conventional nonvolatile CAMs may include cells 20 composed of two ETOX elements. Such cells 20 consume a large amount of current and require the use of transistors with high voltage characteristics. It would be desirable for the conventional CAM to consume a smaller amount of area, for example by using a smaller number of transistors. In addition, the use of low voltage devices would also be desired to reduce the overhead for each CAM cell 10.

Accordingly, what is needed is a method and system for providing a CAM. The present invention addresses such a need.

BRIEF SUMMARY OF THE INVENTION

A method and system for providing a content addressable memory (CAM) cell and the CAM are disclosed. In one aspect, the method and system comprise providing a plurality of memory cells, a plurality of search lines and a plurality of match lines. Each of the memory cells includes a single FLOating gate Tunnel OXide (FLOTOX) element. The FLOTOX element includes a single floating gate transistor and a high voltage select transistor and can store at least a portion of a data word. Each CAM cell also preferably includes a comparator that may be composed of low voltage transistors capable of comparing the portion of data word stored in the FLOTOX element with the portion of searched word. Each memory cell is capable of storing at least a portion of the data word. The search line(s) provide search word(s). The match line(s) indicate whether the search word matches the data word stored by the portion of the plurality of memory cells.

According to the method and system disclosed herein, a nonvolatile CAM using fewer transistors per memory cell and thus having reduced logic overhead per memory cell and reduced power consumption.

DETAILED DESCRIPTION OF THE INVENTION

The method and system relate to semiconductor devices. The following description is presented to enable one of ordinary skill in the art to make and use the method and system and is provided in the context of a patent application and its requirements. Various modifications to the embodiments and the generic principles and features described herein will be readily apparent to those skilled in the art. Thus, the method and system are not intended to be limited to the embodiments shown, but is to be accorded the widest scope consistent with the principles and features described herein.

A method and system for providing a content addressable memory (CAM) and the CAM are disclosed. In one aspect, the method and system comprise providing a plurality of memory cells, at least one search line and at least one match line. Each of the memory cells includes a single FLOating gate Tunnel OXide (FLOTOX) element. The FLOTOX element includes a single floating gate transistor and a high voltage select transistor and can store at least a portion of a data word. Each CAM cell also preferably includes a comparator with low voltage transistors capable of comparing the portion of data word stored in the FLOTOX element with the portion of searched word. Each memory cell is capable of storing at least a portion of the data word. The search line(s) provide search word(s). The match line(s) indicate whether the search word matches the data word stored by the portion of the plurality of memory cells.

The method and system will be described in terms of a particular CAM, one of ordinary skill in the art will readily recognize that other CAMs may be provided. The method and system are also described in the context of a particular number of memory cells, rows, columns, and/or other components. One of ordinary skill in the art will readily recognize that the method and system are consistent with the use of other number(s) of memory cells, rows, columns, and/or other components.

Figure 1:
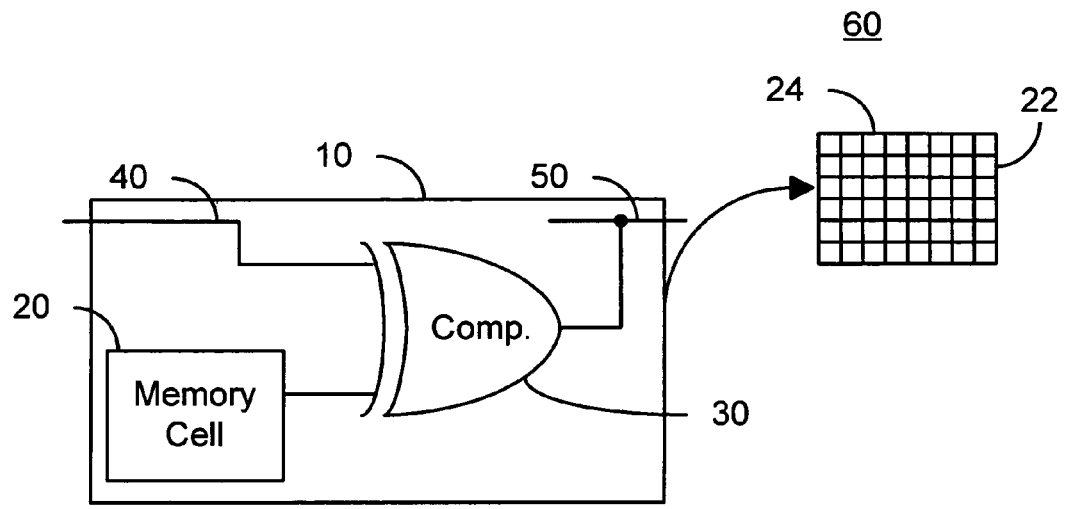
FIG. 1 is a diagram of a conventional content addressable memory cell and a global content addressable memory.
Figure 2:
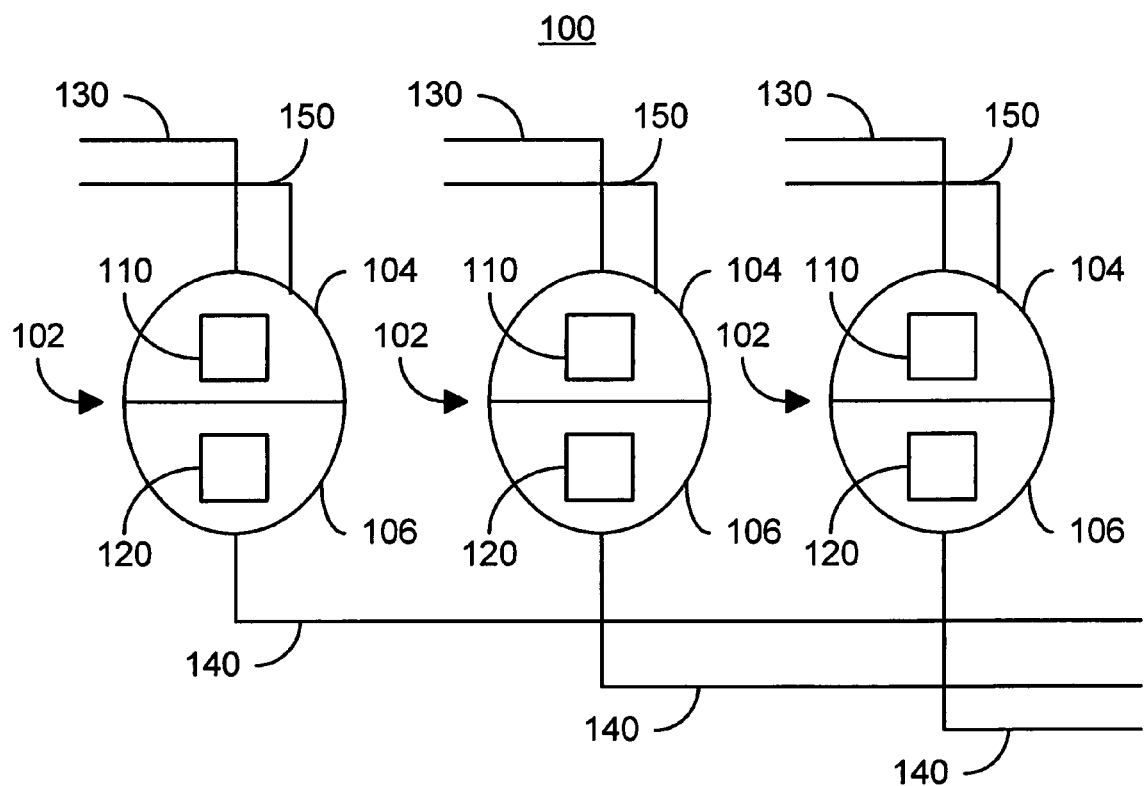
FIG. 2 is a diagram depicting one embodiment of a content addressable memory in accordance with the present invention.

To more particularly describe the present invention, refer to FIG. 2 depicting one embodiment of a CAM 100 composed of three CAM cells belonging to the same row in accordance with the present invention. The CAM 100 includes CAM cells 102, search line(s) 130, match line(s) 140, and control line(s) 150. For clarity, the details of only one CAM cell 102 are shown. The CAM cell 102 includes a high voltage portion 104 and a low voltage portion 106. The high voltage portion includes one unique FLOTOX element 110, while the low voltage portion may include low voltage transistors 120. The voltages of the low voltage transistors 120 may vary depending upon the technology node. For example, in one hundred fifty nanometer technology node CMOS, the maximum working voltage for such a low voltage transistor 120 would be 4.5 V, with a 1.8 V preferred working voltage. One ordinary skill of the art will recognize that the FLOTOX element 110 includes a single floating gate transistor associated with a select transistor. The search line(s) 130 provide a search word against which the contents CAM cells 102 are compared. The low voltage transistors 120 help to determine whether the state of the FLOTOX element 110 is the same as that of the search line(s) 130. The match line 140 provides an output that is based on whether the data in the CAM cells 102 matches the search word. In a preferred embodiment, a match causes the match line 140 to remain charged, while a failure to match results in the match line 140 discharging.

Because one is connected to the source of one unique FLOTOX element 110, a small number of low voltage transistors 120 may be used. As a result, the CAM 100 may have a smaller logic overhead for each CAM cell 102. In addition, power consumption may be reduced.

Figure 3:
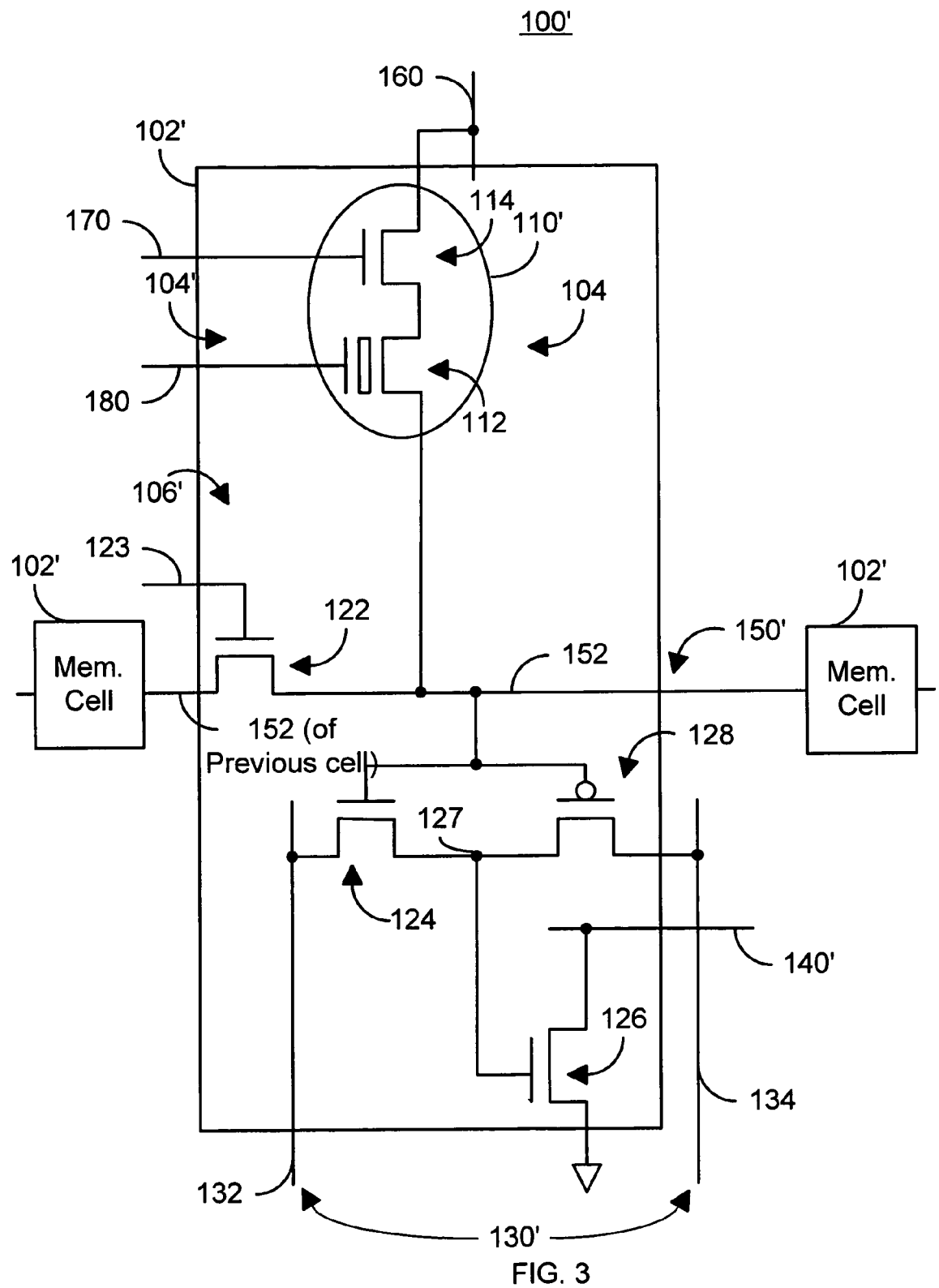
FIG. 3 is a diagram depicting another embodiment of a content addressable memory in accordance with the present invention.
Figure 4:
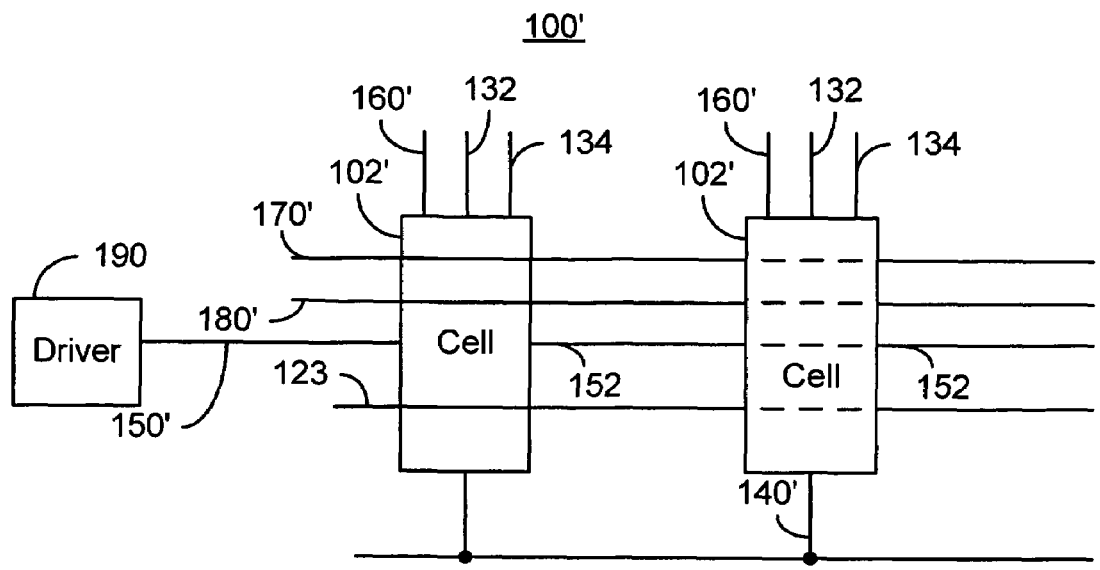
FIG. 4 is a diagram depicting architecture for a content addressable memory utilizing a memory cell in accordance with the present invention.

FIG. 3 is a diagram depicting another embodiment of a CAM 100' in accordance with the present invention. Note that although the details of only one CAM cell 102' are shown, the CAM 100' preferably includes numerous cells 102' arranged in rows and columns. Portions of the CAM 100' are analogous to the CAM 100 and are, therefore, labeled similarly. Consequently, the CAM 100' includes CAM cells 102' having high voltage 104' and low voltage 106' portions, search lines 130' (including search lines 132 and 134), match line 140', control line 150', bit line 160, word line 170, and a reference line 180. The CAM cells 102' are preferably arranged in an array of rows and columns. Each column corresponds to search lines 132 and 134 and bit line 160. Thus, in a preferred embodiment, the CAM cells 102' in a column are connected to, and thus share, a pair of search lines 132 and 134 and a bit line 160. The CAM cells 102' in a row preferably correspond to a match line 140', a control line 150', a word line 170, and a reference line 180. The CAM cells 102' in a row are connected to, and thus share, a match line 140', a control line 150', a word line 170, and a reference line 180. FIG. 4 depicts a row of CAM cells 102' in the CAM 100' in addition to a voltage driver 190. The voltage driver 190 is used to set the potentials on control line 150 of the CAM 100' when writing to a CAM cell 102'.

Referring to FIGS. 3 and 4, each CAM cell 102' includes a unique FLOTOX element 110' in the high voltage portion 104' and low voltage transistors 122, 124, 126, and 128 in the low voltage portion 106'. The transistors 122, 124, and 126 are preferably NMOS transistors, while the transistor 128 is preferably a PMOS transistor. The FLOTOX element 110' includes a floating gate transistor 112 as well as an additional transistor 114.

In order to program or erase the FLOTOX memory element 110', the FLOTOX memory element 110' is biased with a high voltage. The floating gate of the floating gate transistor 112 is discharged or charged with electrons, thereby changing the threshold voltage of the floating gate transistor 112 to a high threshold voltage (Vth) or a low threshold voltage (Vtl). In a preferred embodiment, the FLOTOX memory element 110 with Vth corresponds to a logic state of "1", while the FLOTOX memory element 110 with Vtl corresponds to a logic state of "0".

Figure 5:
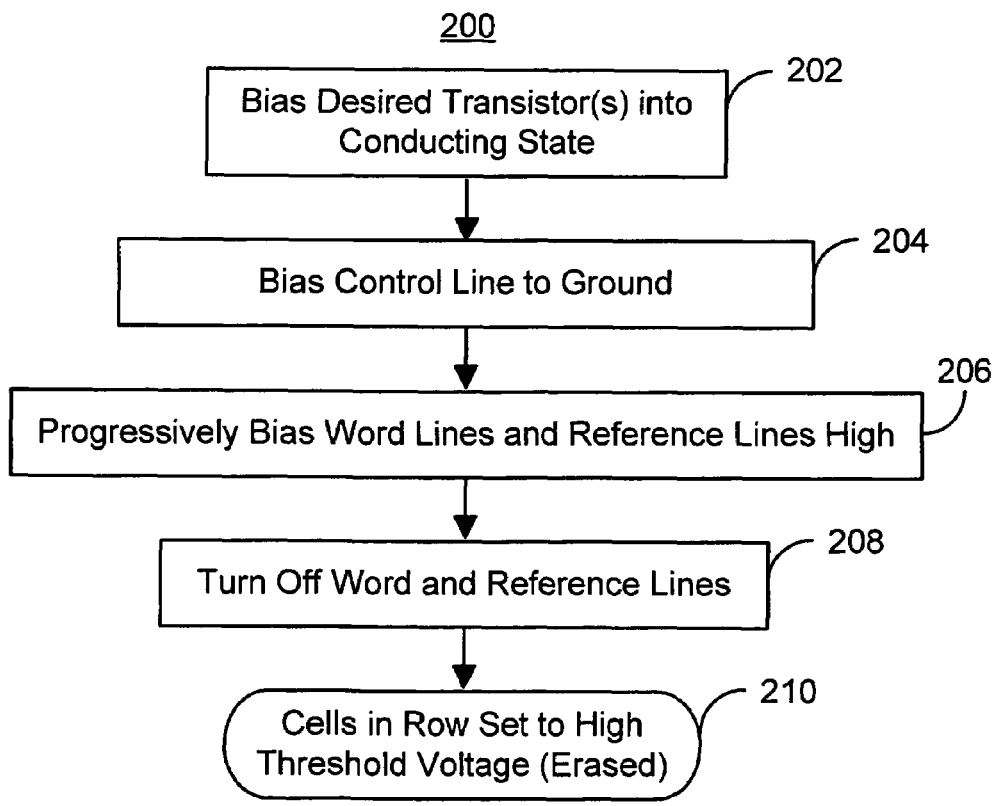
FIG. 5 is a flow chart depicting one embodiment of a method for erasing a cell of a content addressable memory.

In operation, a CAM cell 102' can be erased, programmed, and read. Typically, these operations are carried out row by row. FIG. 5 depicts one embodiment of a method 200 for erasing a row in a CAM 100'. For clarity, the method 200 is described in the context of the method CAM 100'. In addition, the method 200 is described in the context of performing functions for multiple cells 102' substantially simultaneously. However, one of ordinary skill in the art will readily recognize that another number of cell(s) 102' may be operated on. However, one of ordinary skill in the art will readily recognize that the method 200 might also be used with a similar CAM (not shown). In addition, for clarity, steps may be omitted or combined.

The gate of the low voltage transistors 122 having its source connected to the FLOTOX element 110' is driven to VSSBOOST by biasing the node 123 via step 202. VSSBOOST may be approximately 3.3 volts through 5 volts. In a preferred embodiment, when an entire row is erased, the gates of all the transistors 122 in the row are driven high in step 202. In addition, the control line 150 corresponding to the row is set to ground, via step 204. As a result, the source voltages for the components 112 and 114 of the FLOTOX element 110' are driven to ground. The bit lines 160 for all of the columns are in high impedance. The word line 170 and reference line 180 are progressively driven to a high voltage, Vm, that is preferably approximately close to 15 volts, via step 206. Because the components 112 and 114 of the FLOTOX element 110' have their gates connected to the lines 180 and 170, respectively, the components 112 and 114 are turned on in response to step 206 being carried out. As a result, the bit lines 160 are also driven to ground. As a result, electrons are injected into the floating gate of the floating gate transistor 112. This electron injection performs an erase of the FLOTOX element 110'. After a period of time sufficient to complete the erase, the high voltage applied in step 206 to the lines 170 and 180 is turned off, via step 208. A voltage of Vth (the higher threshold voltage) is thus achieved for the component 112 of the FLOTOX element 110', as shown in step 210. As a result, the FLOTOX element 110' is in a logical "1" state. Consequently, the electrical storage cell(s) 110' can be erased.

Figure 6:
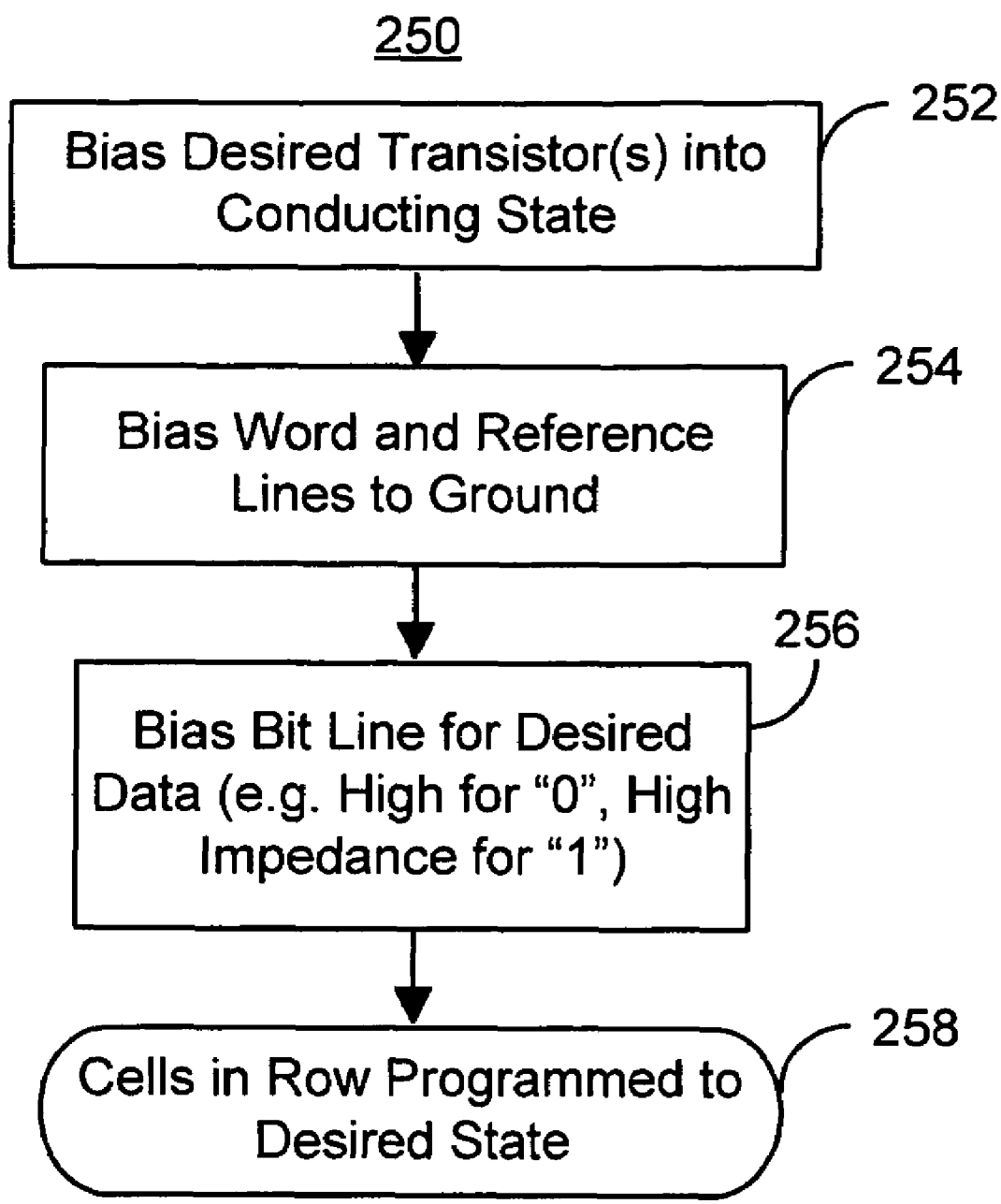
FIG. 6 is a flow chart depicting one embodiment of a method for programming a cell of a content addressable memory.

FIG. 6 is a flow chart depicting one embodiment of a method 250 for programming a CAM 100/100'. For clarity, the method 250 is described in the context of the method CAM 100'. However, one of ordinary skill in the art will readily recognize that the method 250 might also be used with a similar CAM (not shown). In addition, the method 250 is described in the context of performing functions for multiple cells 102' substantially simultaneously. However, one of ordinary skill in the art will readily recognize that another number of cell(s) 102' may be operated on. In addition, for clarity, steps may be omitted or combined.

The gate of the low voltage transistors 122 having its source connected to the FLOTOX element 110' is driven high by biasing the node 123, via step 252. Thus, the gate of the transistor 122 is preferably biased with the voltage VSSBOOST, turning on the transistor 122. VSSBOOST may be approximately 3.3 volts through 5 volts. The word line 170 is driven to Vm, approximately 15 volts, the reference line 180 is driven to ground, the control line 150 is driven to VSSDRIVE preferably close to 1.2 volts, via step 254. Consequently, the component 112 of the FLOTOX cell 102' is turned off and the component 114 of the FLOTOX cell 102' is turned on. The bit line 160' is biased for the appropriate data, logical "1" or "0", for each cell 102', via step 256. To write the logical "0", the bit line 160 is biased high in step 256. Consequently, electrons may be ejected from the floating gate of the transistor 112. The threshold voltage of the FLOTOX element 110' is thus set to Vtl. If, however, a "1" is desired to be written, then the status of the cell 110 may be maintained. If it is determined that a "1" is to be written, then the bit line 160 is set to a high impedance in step 256. As a result, no electrons are ejected from the floating gate of the floating gate transistor 112. As a result, the "1" state is maintained. Thus, the desired data is written to the CAM cells 102', as shown in item 258. Consequently, the CAM 100' can be programmed and erased.

Figure 7:
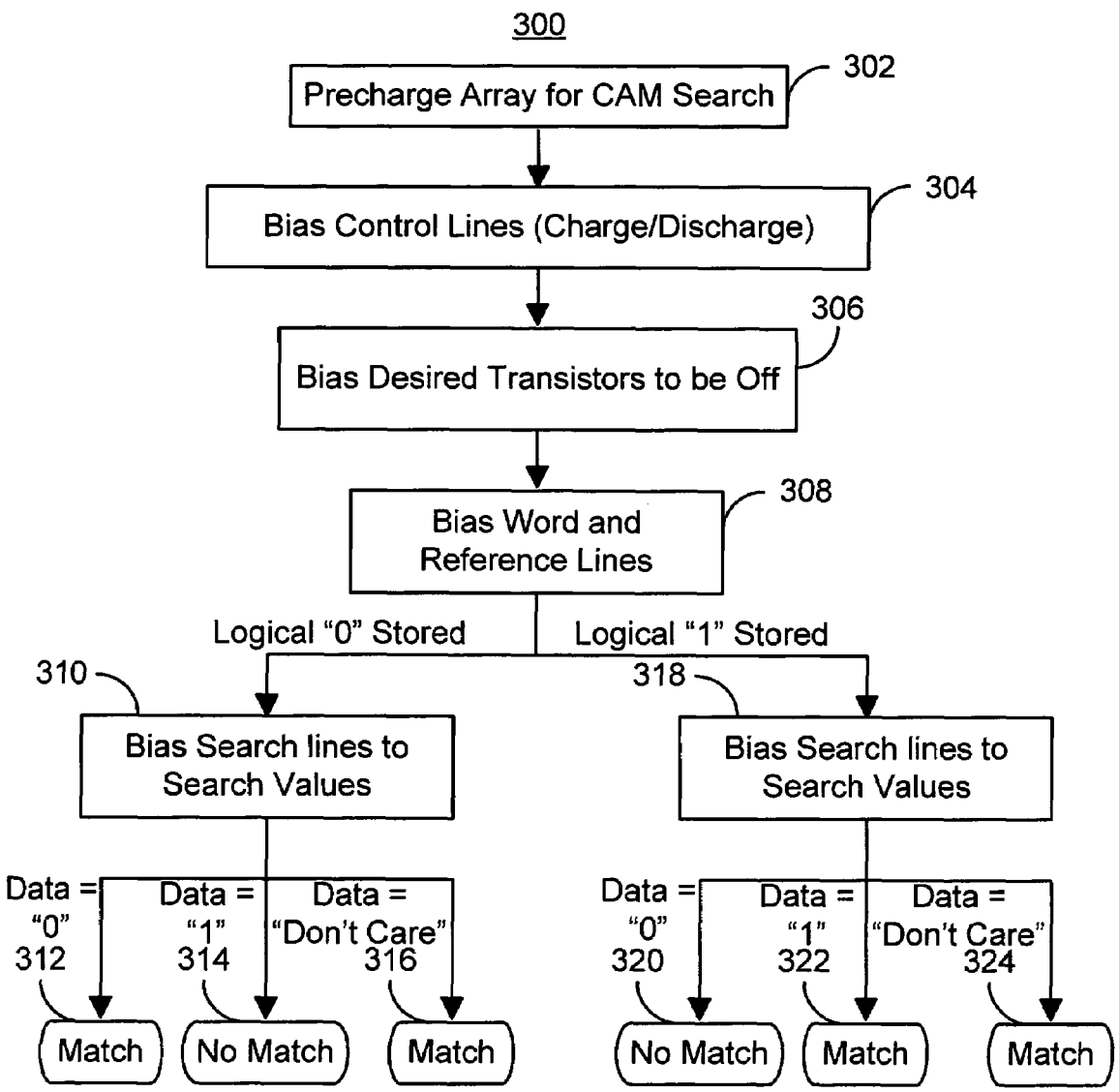
FIG. 7 is a flow chart depicting one embodiment of a method for reading a content addressable memory.
Figure 8:
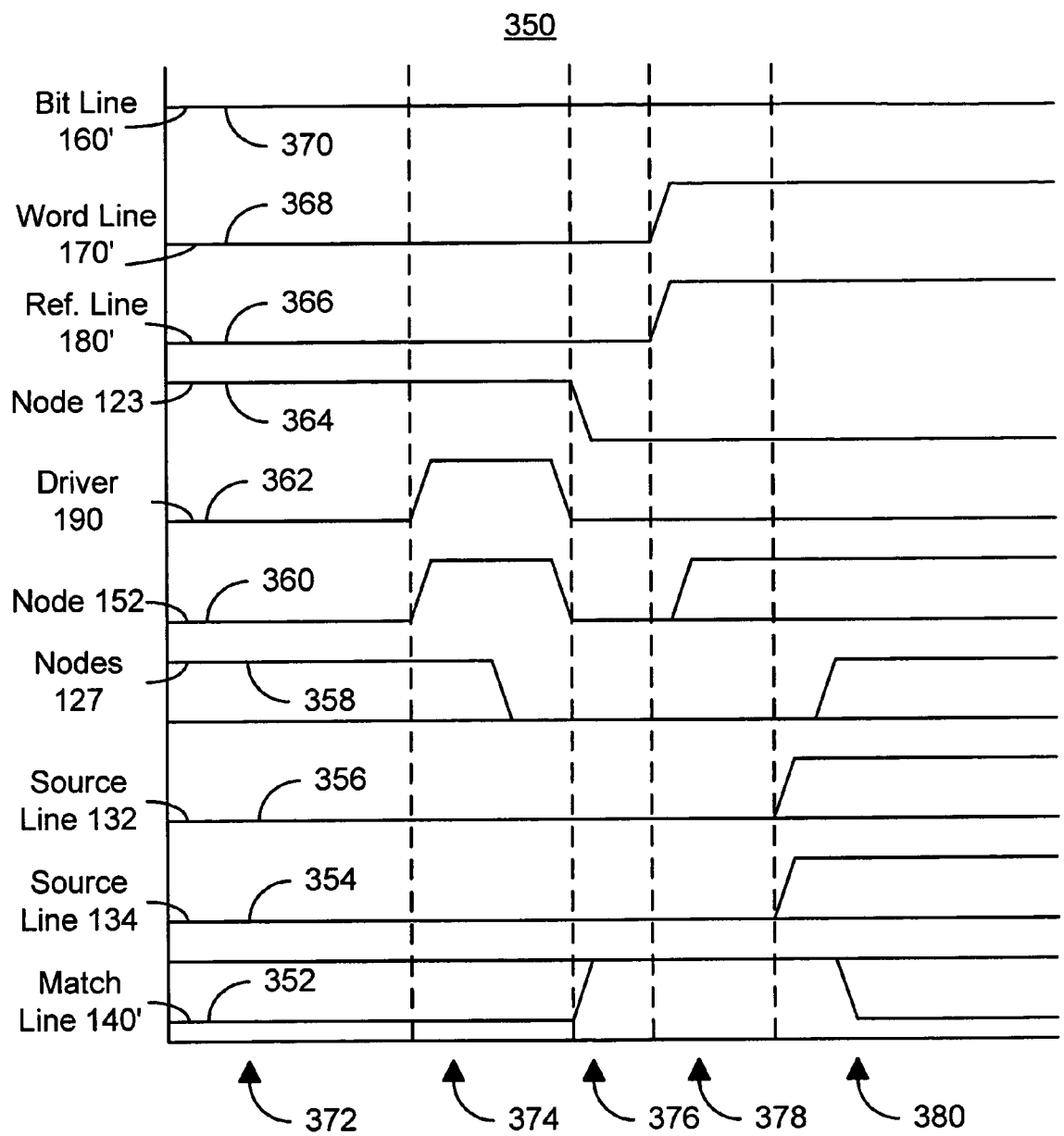
FIG. 8 is a graph depicting one embodiment of signals used in connection with a method for reading a content addressable memory.

FIG. 7 is a flow chart depicting one embodiment of a method 300 for reading a content addressable memory, such as the CAM 100/100'. The method 300 is, therefore, described in the context of the CAM 100'. However, one of ordinary skill in the art will readily recognize that the method 300 might also be used with a similar CAM (not shown). FIG. 8 is a graph 350 depicting one embodiment of signals 352, 354, 356, 358, 360, 362, 364, 366, 368, and 370 used in connection with a method for reading a content addressable memory. The signals 352, 354, 356, 358, 360, 362, 364, 366, 368, and 370 are from designated portions of the CAM 100'. The method 300 is, therefore, described in the context of the graph 350. In addition, the method 300 is described in the context of performing functions for multiple cells 102' substantially simultaneously. However, one of ordinary skill in the art will readily recognize that another number of cell(s) 102' may be operated on. In addition, for clarity, steps may be omitted or combined.

The desired cells 110' in the array of the CAM 100' are precharged, via step 302. In step 302, word lines 170, reference lines 180, bit lines 160, search lines 132 and 134, and nodes 123 for transistors 122 are biased. Step 302 includes biasing the word line 170 and the reference line 180 to ground. Consequently, the FLOTOX elements 110 are not addressed. Step 302 also includes biasing the search lines 132 and 134 to ground. The bit lines 160 are also precharged to a voltage VPCHBL in step 302. The voltage VPCHBL is preferably approximately at VDD. In addition, all of the nodes 123 to the transistors 122 of the appropriate memory cells 102' are set to VDD, which may be approximately 1.8 volts. Consequently, the transistors 122 are conducting. This situation is shown in region 372 of the graph 350.

The nodes 152 on the control line 150 are biased over time, via step 304. This situation is shown in region 374 of the graph 350. In particular, the drive voltage VSSDRIVE is provided to all control lines 150 in step 304. This voltage VSSDRIVE is preferably approximately 1.2 volts. As a result, the transistors 124 become conducting. Consequently, the nodes 127 are discharged to ground because of current flow through the transistor 124 to the search lines 132. Once the nodes 127 are discharged, the driver 190 then drives the control lines 150 to ground in step 304. As the nodes 127 are discharged, the transistors 126 are switched off. As a result, the match lines 140' may be precharged to a voltage VPCHML which may be approximately 1.8 through 3.3 volts and with the help of an additional precharge circuitry (not shown).

In parallel with step 304, the node 123 is driven to ground, via step 306. Thus, steps 304 and 306 are occurring serially.

Consequently, the transistors 122 are switched off and the nodes 152 along the control line 150 are floating but set to ground and disconnected with each other. This situation is shown in region 376 of the graph 350.

Thus, using steps 302, 304, and 306, the array of cells 102' are prepared for a search. The data are then inserted into the array and comparison with stored values results in the corresponding match lines 140' remaining charged or being discharged. Thus, the word lines 170 and reference lines 180 are biased with voltages VBOOST and VSENSE, respectively, via step 308. VBOOST is preferably approximately 3.3 volts while VSENSE may be approximately 0.5 through 0.9 volts. This situation is shown in region 378 of the graph 350. Consequently, in a preferred embodiment, all of the cells 102' are preferably addressed at substantially the same time. Depending upon the specific threshold voltage of each floating gate transistors 112 in the FLOTOX element 110', the voltages on the nodes 152 of the control lines 150 change.

If the threshold voltages of the floating gate transistors 112 are low (Vtl), the FLOTOX element 110' is in a logical "0" state. The resulting situation is shown in region 380 of the graph 350. Due to the state of the FLOTOX element 110', the control line 150 is charged to approximately VPCHBL, preferably close to 1.8 volts, due to the voltage on the bit line 160. Consequently, the transistor 124 turns on and the transistor 128 turns off. The search lines 132 and 134 go to the value being searched and its complement, via step 310. If the search value is a logical "0", then there should be a match. For a logical "0", the search line 132 is at ground, while the search line 134 carries the complement VDD. In this case, the node 127 is driven to ground because of the search line 132 being at ground while the transistor 124 is on. The transistor 128 stays off because the voltage at the node 127 is less than the threshold voltage of the transistor 128. There is no current through the transistor 128 and, therefore, a match for the FLOTOX element 110' is found in step 312. On the other hand, for a logical "1" being searched, the search line 132 is at VDD, while the search line 134 carries the complement, ground, via step 310. Consequently, the node 127 is driven to the voltage on the control line 150 minus the threshold voltage of the transistor 124. This voltage is approximately VPCHBL (VDD) minus the threshold voltage of the transistor 124. It is ensured that this voltage is greater than the threshold voltage of the transistor 126. Consequently, current flows through the transistor 126, the match line 140' is discharged, and no match is found, via step 314. If a "don't care" is provided on the search lines 132 and 134, then both lines 132 and 134 remain at ground in step 310. Consequently, the node 127 is driven to ground due to the transistor 124. As a result, the transistor 126 stays off because the threshold voltage of the transistor 126 is greater than the voltage of the node 127, and a match is found in step 316.

If the threshold voltage of the floating gate transistors 112 are high (Vth), the FLOTOX element 110' is in a logical "1" state. The resulting situation is shown in region 380 of the graph 350. In one such embodiment, the nodes 152 along control line 150 are floating but set to ground and disconnected with each other. Consequently, the transistor 124 is off while the transistor 128 is on. The search lines 132 and 134 go to the value being searched and its complement, via step 318. If the search value is a logical "1", then there should be a match. For a logical "0", the search line 132 is at ground, while the search line 134 carries the complement VDD. In this case, the node 127 is driven to VDD because the transistor 128 is on. The transistor 126 is also conducting because the voltage of the node 127 is greater than the threshold voltage of the transistor 126. As a result, current flows through the transistor 126, discharging the match line 140' to ground, and no match for the FLOTOX element 110' is found in step 320. On the other hand, for a logical "1" being searched, the search line 132 is at VDD, while the search line 134 carries the complement, ground in step 318. As the search line 134 is driven to ground, the node 127 that was previously discharged stays at ground and the transistor 126 remains off because the voltage at the node 127 is less than the threshold voltage of the transistor 126. Consequently, no current flows through the transistor 126 to discharge the match line 140'. Thus, the match line 140' remains high and a match is found in step 322. If a "don't care" is provided on the search lines 132 and 134, then both lines 132 and 134 remain at ground in step 316. As the search line 134 is driven to ground, the node 127 that was previously discharged stays at ground. As described above, therefore, the transistor 126 is off. Because no current flows through the transistor 126, the match line 140' remains high, and a match is found, via step 324.

Thus, the CAM 100/100' can be written, erased, and rapidly searched. As described above, the CAM 100/100' is also capable of searching "don't care" conditions provided by the search lines. The CAM 100/100' utilizes a unique FLOTOX element 110/110' in an high voltage part 104/104' of each CAM cell 102/102'. Consequently, the logic overhead per cell may be reduced. This is because low voltage transistors may be used in a low voltage part 106/106'. Thus, the CAM cells 102/102' may be apportioned into high voltage regions 104/104' that contain the FLOTOX element 110/110' and low voltage regions 106/106' containing the low voltage transistors. The transistors 122, 124, 126, and 128 may be low voltage transistors contained in the part 106/106'. Thus, the overhead for the logic (including the transistors 122, 124, 126, and 128) may be reduced. Moreover, as can be seen in FIGS. 3-4, regardless of the logical state of the FLOTOX element 110/110', there is never constant DC path between the voltage line and ground. Consequently, a small current may be drawn by the CAM 100/100'.

Figure 9:
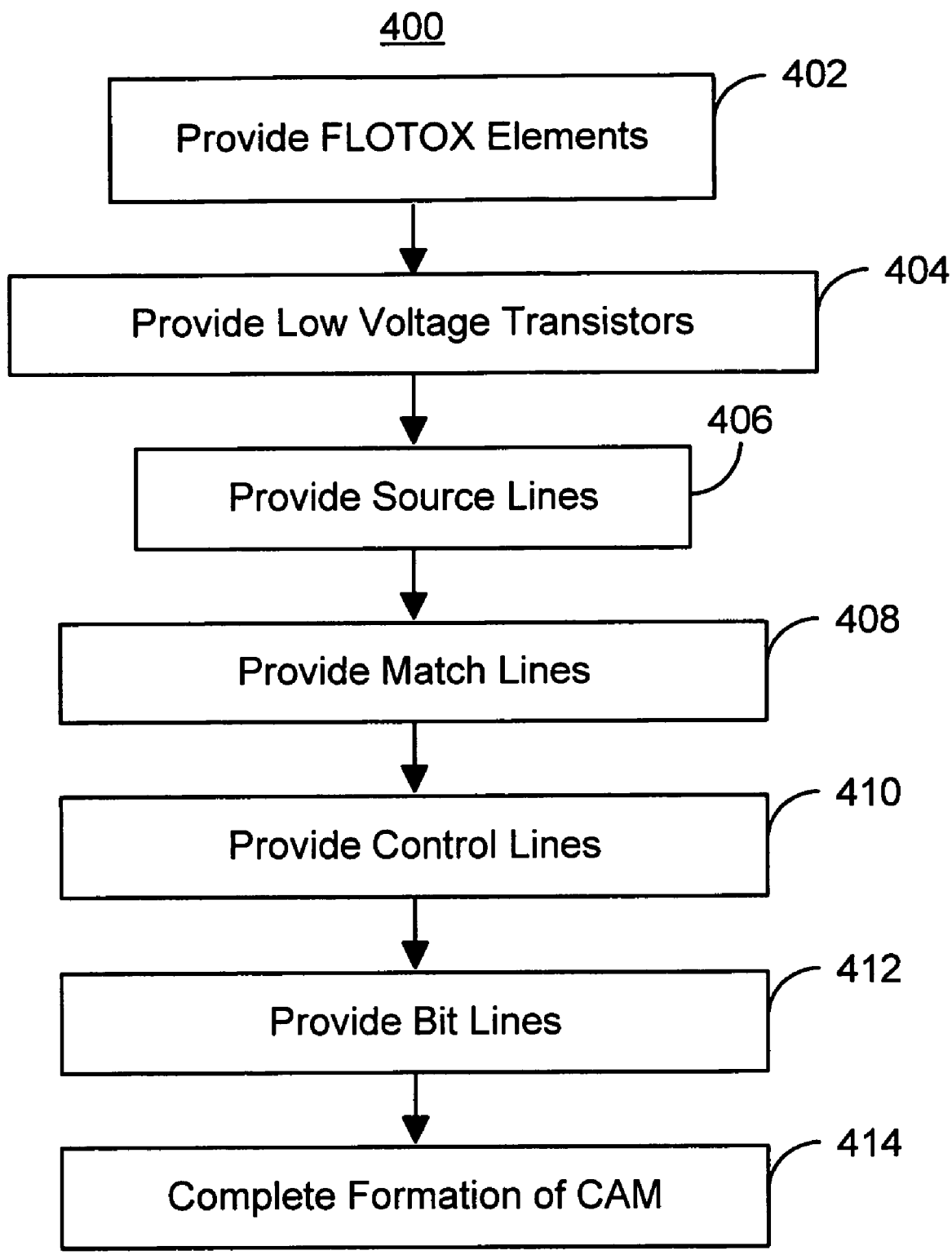
FIG. 9 is a flow chart depicting one embodiment of a method for providing a content addressable memory.

FIG. 9 is a flow chart depicting one embodiment of a method 400 for providing a content addressable memory. The method 400 is described in the context of the CAM 100'. However, one of ordinary skill in the art will readily recognize that the method 400 could be used in providing another CAM (not shown). In addition, for clarity, steps may be omitted or combined.

The FLOTOX elements 110' are formed for the CAM cells 102', via step 402. Step 402 may include forming floating gate transistor 112 as well as transistor 114. The low voltage portion of the CAM cell 102', including the low voltage transistors 122, 124, 126, and 128 are formed, via step 404. The search lines 132 and 134 are formed, via step 406. The match lines 140' are also formed, via step 408. The control line 150 is also formed, via step 410. Also formed are the bit lines 160, via step 412. The CAM 100' is completed, via step 414. Step 414 includes forming a number of features including but not limited to the driver 190. Thus, using the method 400, a CAM, such as the CAMs 100 and 100' may be formed. Consequently, the benefits of the CAMs 100/100' may be achieved.

A method and system for fabricating a CAM, having improved performance are described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A device comprising:
   a content addressable memory (CAM) cell including a single floating gate transistor; and
   a circuit to compare a value of data stored in the CAM cell with a value of a selected data from one of a first data received at a first line coupled to the CAM cell and a second data received at a second line coupled to the CAM cell, wherein the circuit further includes a pair of transistors to control a value at a node, based on the value of the data stored in the CAM cell, to determine whether the value of the data stored in the CAM cell matches the value of the selected data.

2. The device of claim 1, wherein the CAM cell further includes a transistor coupled between the single floating gate transistor and a line that is configured to transfer data to be stored in the CAM cell.

3. A device comprising:
   a content addressable memory (CAM) cell including a single floating gate transistor and a single transistor coupled between the single floating gate transistor and an additional floating gate transistor of an additional CAM cell of the device,
   wherein the CAM cell and the additional CAM cell are configured to store a portion of multiple bits of a data word.

4. A device comprising: a content addressable memory (CAM) cell including a single floating gate transistor, wherein the CAM cell further includes:
   a first transistor coupled between a first terminal of the single floating gate transistor and a line that is configured to transfer data to be stored in the CAM cell;
   a pair of transistors including gates coupled to a second terminal of the single floating gate transistor; and
   a second transistor including a gate coupled to a node shared by transistors of the pair of transistors, and a terminal coupled to a line that is configured to provide an indication of whether a value of a first data stored in the CAM cell matches a value of a second data used to compare with the first data.

5. The device of claim 4, wherein the CAM cell further includes an additional transistor having a first additional terminal coupled to the gates of the pair of transistors and a second additional terminal coupled to an additional single floating gate transistor of an additional CAM cell of the device.

6. The device of claim 4, wherein the first transistor is configured to operate at a first voltage, and each of the second transistor and the pair of transistors is configured to operate at a second voltage lower than the first voltage.

7. A device comprising:
   a content addressable memory (CAM) cell including a single floating gate transistor: and
   a plurality of CAM cells, each CAM cell of the plurality of CAM cells including a single floating gate transistor, the plurality of CAM cells sharing a line with the CAM cell, the line configured to provide an indication of whether a value of a first data stored in at least one of the plurality of CAM cells and the CAM cell matches a value of a second data used to compare with the first data.

8. A method comprising:
   transferring data in a device that includes a content addressable memory (CAM) cell, the CAM cell including a single floating gate transistor, wherein transferring the data includes:
   transferring a first data to a first line coupled to the CAM cell; and
   transferring a second data to a second line coupled to the CAM cell, wherein a selected data among the first data and the second data is used to compare with a data stored in the CAM cell; and
   transferring a third data to a third line coupled to an additional CAM cell of the device; and
   transferring a fourth data to a fourth line coupled to the additional CAM cell, wherein an additional selected data among the third data and the fourth data is used to compare with a data stored in the additional CAM cell.

9. The method of claim 8, wherein the CAM cell stores a first bit of multiple bits of a data word, and the additional CAM cell stores a second bit of the multiple bits.

10. A method comprising:
    transferring data in a device that includes a content addressable memory (CAM) cell, the CAM cell including a single floating gate transistor, wherein transferring the data includes:
    transferring a first data to a first line coupled to the CAM cell; and
    transferring a second data to a second line coupled to the CAM cell, wherein a selected data among the first data and the second data is used to compare with a data stored in the CAM cell, wherein the second data has a logic one value if the first data has a logic zero value, and the second data has the logic zero value if the first data has the logic one value.

11. The method of claim 10 further comprising:
    generating a match indication if a value of the data stored in the CAM cell matches a value of the selected data; and
    generating a no match indication if the value of the data stored in the CAM cell is different from the value of the selected data.

12. The method of claim 10 further comprising:
    generating a match indication if the value of the data stored in the CAM cell is different from the value of the selected data.

13. The method of claim 12, wherein the first data and the second data have a same value.

14. The method of claim 10, wherein transferring the data is performed during a read operation of the device.

15. The method of claim 10, wherein transferring the data is performed during a programming operation of the device.

16. The method of claim 10, wherein transferring the data is performed during an erase operation of the device.

* * * * *